(12) United States Patent
Forrest et al.

(10) Patent No.: US 7,343,061 B2
(45) Date of Patent: Mar. 11, 2008

(54) INTEGRATED PHOTONIC AMPLIFIER AND DETECTOR

(75) Inventors: Stephen R. Forrest, Princeton, NJ (US); Kuen-Ting Shiu, Princeton, NJ (US); Shashank S. Agashe, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 11/274,873

(22) Filed: Nov. 15, 2005

(65) Prior Publication Data

US 2007/0110357 A1   May 17, 2007

(51) Int. Cl.
G02B 6/12 (2006.01)
G02B 6/43 (2006.01)
H01S 5/026 (2006.01)

(52) U.S. Cl. .................. 385/14; 385/28; 385/40; 385/43; 385/50; 372/50.21; 372/50.22

(58) Field of Classification Search .................. None
See application file for complete search history.

(56) References Cited

U.S. PATENT DOCUMENTS

| | | | |
|---|---|---|---|
| 5,039,189 A | 8/1991 | Lytel et al. | 385/2 |
| 5,078,516 A | 1/1992 | Kapon et al. | 385/129 |
| 5,134,671 A * | 7/1992 | Koren et al. | 385/14 |
| 5,140,149 A | 8/1992 | Sakata et al. | 250/211 J |
| 5,208,878 A | 5/1993 | Thulke | 385/14 |
| 5,262,656 A * | 11/1993 | Blondeau et al. | 257/80 |
| 5,325,379 A | 6/1994 | Amann | 372/20 |
| 5,355,386 A | 10/1994 | Rothman et al. | 372/50 |
| 5,499,259 A | 3/1996 | Makita | 372/45 |
| 5,500,867 A | 3/1996 | Krasulick | 372/38.02 |
| 5,509,094 A | 4/1996 | Minami et al. | 385/29 |
| 5,511,084 A | 4/1996 | Amann | 372/20 |
| 5,568,311 A | 10/1996 | Matsumoto | 359/344 |
| 5,574,742 A | 11/1996 | Ben-Michael et al. | 372/45 |
| 5,623,363 A | 4/1997 | Liou | 359/344 |
| 5,663,824 A | 9/1997 | Koch et al. | 359/184 |
| 5,708,671 A | 1/1998 | Siao et al. | 372/20 |

(Continued)

FOREIGN PATENT DOCUMENTS

CN   1118527   3/1996

(Continued)

OTHER PUBLICATIONS

Alferness, R.C., et al., "Vertically coupled INGAASP/INP buried rib waveguide filter," *Applied Physics Letts.*, 1991, 59(20), 2573-2575.

(Continued)

*Primary Examiner*—Rodney Bovernick
*Assistant Examiner*—Omar Rojas
(74) *Attorney, Agent, or Firm*—Woodcock Washburn LLP

(57) ABSTRACT

An asymmetric twin waveguide (ATG) structure with an integrated amplifier and detector fabricated in a single active waveguide layer is disclosed. The structure comprises an active waveguide layer formed on a passive waveguide layer. The active and passive waveguides have different effective indices of refraction such that a first mode of light is confined primarily to the active waveguide and a second mode of light is confined primarily to the passive waveguide in the area where the waveguides overlap.

24 Claims, 6 Drawing Sheets

U.S. PATENT DOCUMENTS

| | | | | |
|---|---|---|---|---|
| 5,715,268 | A | 2/1998 | Lang et al. | 372/50 |
| 5,721,750 | A | 2/1998 | Kwon et al. | 372/44 |
| 5,852,687 | A | 12/1998 | Wickham | 385/14 |
| 5,859,866 | A | 1/1999 | Forrest et al. | 372/50 |
| 5,917,967 | A | 6/1999 | Dubey et al. | 385/14 |
| 5,985,685 | A | 11/1999 | Lealman et al. | 438/31 |
| 6,031,851 | A | 2/2000 | Shimizu et al. | 372/18 |
| 6,051,445 | A | 4/2000 | Dubey et al. | 438/31 |
| 6,111,903 | A * | 8/2000 | Isaksson et al. | 372/50.21 |
| 6,167,073 | A | 12/2000 | Botez et al. | 372/46 |
| 6,198,863 | B1 | 3/2001 | Lealman et al. | 385/37 |
| 6,215,295 | B1 | 4/2001 | Smith, III | 324/95 |
| 6,240,233 | B1 | 5/2001 | Weinert et al. | 385/121 |
| 6,246,965 | B1 | 6/2001 | Cockerham et al. | 702/85 |
| 6,310,995 | B1 | 10/2001 | Saini et al. | 385/28 |
| 6,311,003 | B1 | 10/2001 | Dubey et al. | 385/130 |
| 6,314,117 | B1 | 11/2001 | Landsman et al. | 709/203 |
| 6,330,378 | B1 | 12/2001 | Forrest et al. | 385/14 |
| 6,330,387 | B1 | 12/2001 | Salamon et al. | 385/129 |
| 6,335,994 | B1 | 1/2002 | Kato | 385/50 |
| 6,339,496 | B1 | 1/2002 | Koley et al. | 359/344 |
| 6,381,380 | B1 | 4/2002 | Forrest et al. | 385/14 |
| 6,483,863 | B2 | 11/2002 | Forrest et al. | 372/50 |
| 6,490,044 | B1 | 12/2002 | Koch et al. | 356/478 |
| 6,519,374 | B1 | 2/2003 | Stook et al. | 385/2 |
| 6,668,103 | B2 | 12/2003 | Hosoi | 385/2 |
| 6,795,622 | B2 | 9/2004 | Forrest et al. | 385/50 |
| 6,819,814 | B2 | 11/2004 | Forrest et al. | 385/14 |
| 7,110,170 | B2 * | 9/2006 | Lee et al. | 359/344 |
| 7,251,407 | B2 * | 7/2007 | Najda | 385/131 |
| 2002/0018504 | A1 | 2/2002 | Coldren | 372/50 |
| 2002/0031297 | A1 | 3/2002 | Forrest et al. | 385/28 |
| 2002/0097941 | A1 | 7/2002 | Forrest et al. | 385/1 |
| 2003/0012244 | A1 | 1/2003 | Krasulick et al. | 372/50 |
| 2003/0141511 | A1 * | 7/2003 | Marsh et al. | 257/98 |
| 2004/0096175 | A1 | 5/2004 | Tolstikhin | 385/131 |
| 2006/0226285 | A1 | 10/2006 | Matsui | 244/99.6 |

FOREIGN PATENT DOCUMENTS

| | | |
|---|---|---|
| EP | 0 263 640 B1 | 1/1993 |
| FR | 2 337 449 | 7/1977 |
| GB | 2 105 863 A | 3/1983 |
| JP | 2000-228558 | 8/2000 |
| WO | WO 99/67665 | 12/1999 |
| WO | WO 03/007057 A3 | 1/2003 |
| WO | WO 03/102678 A1 | 12/2003 |

OTHER PUBLICATIONS

Bach, L., et al., "Wavelength stabilized single-mode lasers by coupled micro-square resonators," *IEEE Photonics Techn. Letts.*, 2003, 15, 377-379.

Bauer, J.G., et al., "High responsivity integrated tapered waveguide PIN photodiode," *Proceedings fo the European Conference on Optical Communication (ECOC)*, Sep. 12-16, 1993, vol. 2, Conf. 19, 277-280.

Bennett, S., et al., "1.8-THz bandwidth, zero-frequency error, tunable optical comb generator for DWDM applications," *IEEE Photonics Techn. Letts.*, 1999, 11(5), 551-553.

Bruckner, H.J.,et al., "Taper-Waveguide integration for polarization insensitive InP/InGaAsP based optical amplifiers," *Electron. Lett.*, 1994, 30(16), 1290-1291.

Claasen, A., et al., "Comparison of diodes and resistors for measuring chip temperature during thermal characterization of electronic packages using thermal test chips," *IEEE 13th Ann. Semiconductor Thermal Measurement & Management Symposium*, 1997, 198-209.

"Coupled cavity modelocked lasers," *Applied Physics*, http://fb6www.uni-paderborn.de, downloaded Mar. 30, 2005, 3 pages.

"Current work on composite-resonator vertical-cavity lasers," *Coupled Cavity VCSELs*, http://vcsel.micro.uiuc.edu, downloaded Mar. 30, 2005, 4 pages.

Dagenais, M., et al., "Alignment tolerant lasers and silicon waferboard integration," *Passive Alignment Techniques for Optoelectronic Transmitter Arrays*, http:www.ee.umd.edu/photonics/papers/spie/SPIE97.htm, 1997, 14 pages.

Dagenais, M., et al., "Complex needs drive optoelectronic integration," *Optoelectronics World*, Jul. 1998, 157-160.

den Besten, J.H., et al., "An integrated coupled-cavity 16-wavelength digitally tunable laser," *IPR*, 2002, 1-3.

Forrest, S.R., et al., "Integrated photonics using asymmetric twin-waveguide structures," *IEEE*, 2000, 13-16.

Fredkin, E., et al., "Conservative Logic," *Int. J. Theor. Phys.*, 1982, 21(3/4), 219-253.

Gokhale, M.R., et al., "Uncooled, 10Gb/s 1310 nm electroabsorption modulated laser," presented at *OFC 2003 (PD-42)*, Atlanta, USA, 2003, 4 pages.

Hamamoto, et al., "Insertion-loss-free 2×2 InGaAsP/InP optical switch fabricated using bandgap energy controlled selective MOVPE," *Electron. Lett.*, 1995, 31(20), 1779-1781.

Hammond, B., et al., "Integrated wavelength locker for turnable laser applications," *15th Ann. Meeting of the IEEE Lasers & Electro-Optics Soc.*, 2002, 2, 479-480.

He, J.-J., et al., "Photonic integrated circuits and components using quantum well intermixing," *Integrated Optoelectronics, Proc. of Spie*, 1996, 2891, 2-9.

Johnson, J.E., et al., "Fully stabilized electroabsorption—modulated tunable DBR laser transmitter for long-haul optical communications," *IEEE J. on Selected Topics in Quantum Electronics*, 2001, 7, 168-177.

Kanjamala, A.P., et al., "Wavelength switching in multicavity lasers," *Am. Inst. Of Physics*, 1997, 71(3), 300-302.

Newkirk, M.A., et al., "1.55 μm multiquantum well semiconductor optical amplifier with low gain ripple and high coupling efficiency for photonic circuit integration," *Electron. Lett.*, 1993, 29(5), 443-444.

O'Dowd, R., et al., "Frequency plan and wavelength switching limits for widely tunable semiconductor transmitters," *IEEE J. Selected Topics in Quantum Electrons*, 2001, 7, 259-269.

Oh, K.R., et al., "Laser amplifier gate switch arrays using reactive ion etching," *Electron. Lett.*, 1996, 32(1), 39-40.

Rabus, D.G., et al., "MMI-coupled ring resonators in GaInAsP-InP," *IEEE Photonics Techn. Letts.*, 2001, 13, 812-814.

Rabus, D.G., et al., "Resonance frequency tuning of a double ring resonator in GaInAsP/InP: Experiment and simulation," *Jpn. J. Appl. Phys.*, 2002, 41, 1186-1189.

Rabus, D.G., et al., "High-Q channel-dropping filters using ring resonators with integrated SOAs," *IEEE Photonics Techn. Letts.*, 2002, 1, 1442-1444.

Saini, S.S., et al., "Compact mode expanded lasers using resonant coupling between a 1.55-μm InGaAsP tapered active region and an underlying coupling waveguide," *IEEE Photonics Technology Letters*, Sep. 1998, 10(9), 1232-1234.

Saini, S.S., et al., "Compact low-loss vertical resonant mode coupling between two well-confined waveguides," *Electronics Letts.*, 1999, 35(14), 2 pages.

Saini, S.S., et al., "Passive active resonant coupler (PARC) platform with mode expander," *IEEE Photonics Techn. Letts.*, 2000, 12(8), 1025-1027.

Sarlet, G., et al., "Control of widely tunable SSG-DBR lasers for dense wavelength division multiplexing," *IEEE J. Lightwave Techn.*, 2000, 18, 1128-1138.

Shi, H., et al., "Relative intensity noise measurements of a widely tunable sampled-grating DBR laser," *IEEE Photonics Techn. Letts.*, 2002, 14, 759-761.

Silva, C.F.C., et al., "A dense WDM source using optical frequency comb generation and widely tunable injection-locked laser filtering techniques," Department of Electrical Engineering, year not available, 4 pages.

Studenkov, P.V., et al., "Efficient Coupling in Integrated Twin-Waveguide Lasers Using Waveguide Tapers", *IEEE Photonics Technology Letters*, 1999, vol. 11, No. 9, pp. 1096-1098.

Studenkov, P.V., et al., "Asymmetric Twin-Waveguide 1.55-μm Wavelength Laser with a Distributed Bragg Reflector", *IEEE Photonics Technology Letters*, 2000, vol. 12, No. 5, pp. 468-470.

Studenkov, P.V., et al., "Monolithic Integration of a Quantum-Well Laser and an Optical Amplifier Using an Asymmetric Twin-Waveguide Structure", *IEEE Photonics Technology Letters*, vol. 10, No. 8, pp. 1088-1090, (1998).

Studenkov, P.V., et al., "Monolithic integration of an all-optical Mach-Zehnder demultiplexer using an asymmetric twin-waveguide structure," *IEEE Photonics Techn. Lett.*, 2001, 13, 600-602.

Suematsu, Y., et al., "Integrated twin-guide AlGaAs laser with multiheterostructure," *IEEE J. Quantum Electron.*, 1973, QE-11(7), 457-460.

Tatsuno, K., et al., "50 GHz spacing, multi-wavelength tunable locker integrated in a transmitter module with a monolithic-modulator and a DFB-laser," *Optical Fiber Commun. Conf.*, 2001, TuB5-1 - TuB5-4.

Tauke-Pedretti, A., et al., "High satuation power and high gain integrated photoreceivers," *IEEE Photonics Technology Letters*, 2005, 17(10, 2167-2169.

Utaka, K., et al., "Measurement of coupling coefficient and coupling length of GaAs/AlGaAs integrated twin-guide injection lasers prepared by liquid-phase epitaxy," *Trans. IECE Japan*, 1979, E-62, 319-323.

Van, V., et al., "Optical signal processing using nonlinear semiconductor microring resonators," *IEEE J. on Selected Topics in Quantum Electronics*, 2002, 8, 705-713.

Vusirikala, V., et al., "1.55- μm InGaAsP-InP laser arrays with integrated-mode expanders fabricated using a single epitaxial growth," *IEEE J. Selected Topics in Quantum Electronics*, Dec. 1997, 3(6), 1332-1343.

Vusirikala, V., et al., "Compact mode expanders using resonant coupling between a tapered active region and an underlying coupling waveguide," *IEEE Photonics Techn. Letts.*, 1998, 10(2), 203-205.

Wang, H., et al., "A fully integratable, 1.55-μm wavelength, continuously tunable asymmetric twin-waveguide distributed bragg reflector laser," *IEEE Photonics Techn. Lett.*, 2003, 15(9), 1189-1191.

Wei, J., et al., "A high-responsivity high-bandwidth asymmetric twin-waveguide coupled InGaAs-InP-InAlAs avalanche photodiode," *IEEE Photonics Techn. Lett.*, 2002, 14, 1590-1592.

Woodward, S.L., et al., "RIN in multisection MQW-DBR lasers," *IEEE Photonics Technology Letts.*, 1990, 2, 104-108.

Woodward, S.L., et al., "A control loop which ensures high side-mode-suppression ratio in a tunable DBR laser," *IEEE Photonics Techn. Letts.*, 1992, 4, 417-419.

Xia, F.N., et al., "Monolithic integration of a semiconductor optical amplifier and a high bandwidth p-i-n photodiode using asymmetric twin-waveguide technology," *IEEE Photonics Techn. Lett.*, 2003, 15, 452-454.

Xu, L., et al., "Monolithic integration of an InGaAsl'-InP MQW laser/waveguide using a twin-guide structure with a mode selection layer," *IEEE Photon. Technol. Lett.*, 1997, 9, 569-571.

Yakoyama, Y., et al., "Multiwavelength locker integrated wide-band wavelength-selectable light source module," *IEEE Photonics Technollogy Letts.*, 2003, 15, 290-292.

Huang, Y., et al., "Reduction of absorption loss in asymmetric twin waveguide laser tapers using argon plasma-enhanced quantum-well intermixing," *IEEE Photonics Techn. Lett.*, 2004, 16(10), 2221-2223.

U.S. Appl. No. 10/983,366, filed May 5,2005, Forrest et al.

* cited by examiner

INTEGRATED PHOTONIC AMPLIFIER AND DETECTOR

GOVERNMENT LICENSE RIGHTS

The U.S. Government may have a paid-up license in the technology disclosed herein and the right in limited circumstances to require the patent owner to license others on reasonable terms as provided for by the terms of contract number DARPA 3416274.

CROSS-REFERENCE TO RELATED APPLICATIONS

This present application is related by subject matter to U.S. patent application Ser. No. 10/983,366 filed Nov. 8, 2004 entitled "Twin Waveguide Based Design for Photonic Integrated Circuits," which is a continuation of U.S. patent application Ser. No. 10/642,316 filed Aug. 15, 2003 and entitled "Twin Waveguide Based Design for Photonic Integrated Circuits," which is a continuation of U.S. patent application Ser. No. 09/982,001 filed Oct. 18, 2001 and entitled "Twin Waveguide Based Design for Photonic Integrated Circuits," which is a continuation of U.S. patent application Ser. No. 09/337,785 filed Jun. 22, 1999 and entitled "Twin Waveguide Based Design for Photonic Integrated Circuits," now U.S. Pat. No. 6,381,380. The present application is also related by subject matter to the following: U.S. patent application Ser. No. 08/797,276 filed Feb. 7, 1997 and entitled "Twin Waveguide Based Design for Photonic Integrated Circuits;" U.S. patent application Ser. No. 09/717,851 filed Nov. 21, 2000 and entitled "Photonic Integrated Detector Having A Plurality of Asymmetric Waveguides;" U.S. patent application Ser. No. 10/163,436 filed Jun. 4, 2002 and entitled "Photonic Integrated Circuits;" U.S. patent application Ser. No. 08/891,639 filed Jun. 26, 2001 and entitled "Asymmetric Waveguide Electro-Absorption Modulated Laser;" and U.S. patent application 11/108,036 filed Apr. 14, 2005 and entitled "Monolithic Wavelength Stabilized Asymmetric Laser."

FIELD OF THE APPLICATION

The present application is related to the field of optical communication devices, and more particularly to integration of amplifier and detector optical components in photonic integrated circuits.

BACKGROUND

Photonic integrated circuits (PICs) provide an integrated technology platform increasingly used to form complex optical circuits. This technology allows multiple optical devices to be integrated on a single substrate. For example, PICs may comprise integrated amplifiers, receivers, waveguides, detectors, and other active and passive optical devices arranged in various configurations.

Asymmetric twin waveguide (ATG) technology has proven to be a promising method for optoelectronic integration and offers a simple fabrication process for even the most complex PIC design. The ATG design significantly reduces modal interference by substantially confining different modes of light to propagation in different waveguides. Modal confinement is accomplished by designing waveguides such that the mode of light that propagates in a waveguide has a different effective index of refraction than the mode of light that propagates in the adjacent waveguide. This feature substantially isolates the light propagating in each waveguide, which lends itself to the specialization of functions performed by the waveguides. Transfer of light between the waveguides is facilitated by lithographically defined taper couplers. The minimal modal interference and efficient coupling result in high-performance lasers, p-i-n and avalanche photodiodes, SOAs, and integrated combinations of these fundamental photonic functionalities. U.S. Pat. Nos. 6,381,380, 6,330,387, 6,483,863, 6,795,622, and 6,819,814, the contents of which are hereby incorporated herein by reference in their entirety, provide a description of ATG and various embodiments of ATG.

While asymmetric photonic devices have simplified photonic integration, applicants have noted an interest in further simplifying fabrication of photonic integrated circuits, and, in particular, asymmetric photonic circuits that integrate amplifier and detector components.

SUMMARY

Applicants disclose herein an asymmetric twin waveguide structure having a photonic semiconductor optical amplifier (SOA) and detector formed in the same active layer of the structure, and with an asymmetric passive waveguide formed therein to transfer light between the amplifier and detector. Forming both the amplifier and detector in the same waveguide and using an asymmetric passive waveguide to isolate the two allows for removing a regrowth step during fabrication that might otherwise be employed.

In an illustrative embodiment, a monolithically integrated device comprises an active waveguide formed on top of a passive waveguide. A cladding layer that is substantially transparent to the movement of light may be positioned between the waveguides. The active waveguide and passive waveguides have different effective indices of refraction, and a first mode of light and a second mode of light propagating in the structure are divided unevenly between the waveguides in the areas where the two waveguides overlap.

A portion of the active waveguide comprises the amplifier. Electrical contacts communicate with the portion of the active waveguide corresponding to the amplifier to apply a forward bias to the active waveguide. The forward bias causes light propagating in the active waveguide to be amplified. The portion of the active waveguide corresponding to the amplifier may have a first and second taper formed therein for facilitating movement of light into and out of the active waveguide. The forward bias that is applied to the active waveguide may be applied to, for example, the portion of the active waveguide located between the first and second tapers. A passive waveguide positioned below the active waveguide communicates light away from the forward biased region of the active waveguide.

A second portion of the active waveguide corresponds to the detector. The detector may have a third taper formed therein for facilitating movement of light into the active waveguide. Light propagating away from the amplifier in the passive waveguide is coupled into the active waveguide in the area of the detector. Electrical contacts communicate with the active waveguide in the area of the detector to apply a reverse bias to the active waveguide. The reverse bias allows for detecting light that is propagating in the active waveguide corresponding to the detector.

These features and others are described below.

BRIEF DESCRIPTION OF THE DRAWINGS

The foregoing summary and the following additional description of the illustrative embodiments may be better understood when read in conjunction with the appended drawings. It is understood that potential embodiments of the disclosed systems and methods are not limited to those depicted.

In the drawings.

DETAILED DESCRIPTION OF ILLUSTRATIVE EMBODIMENTS

Figure 1:
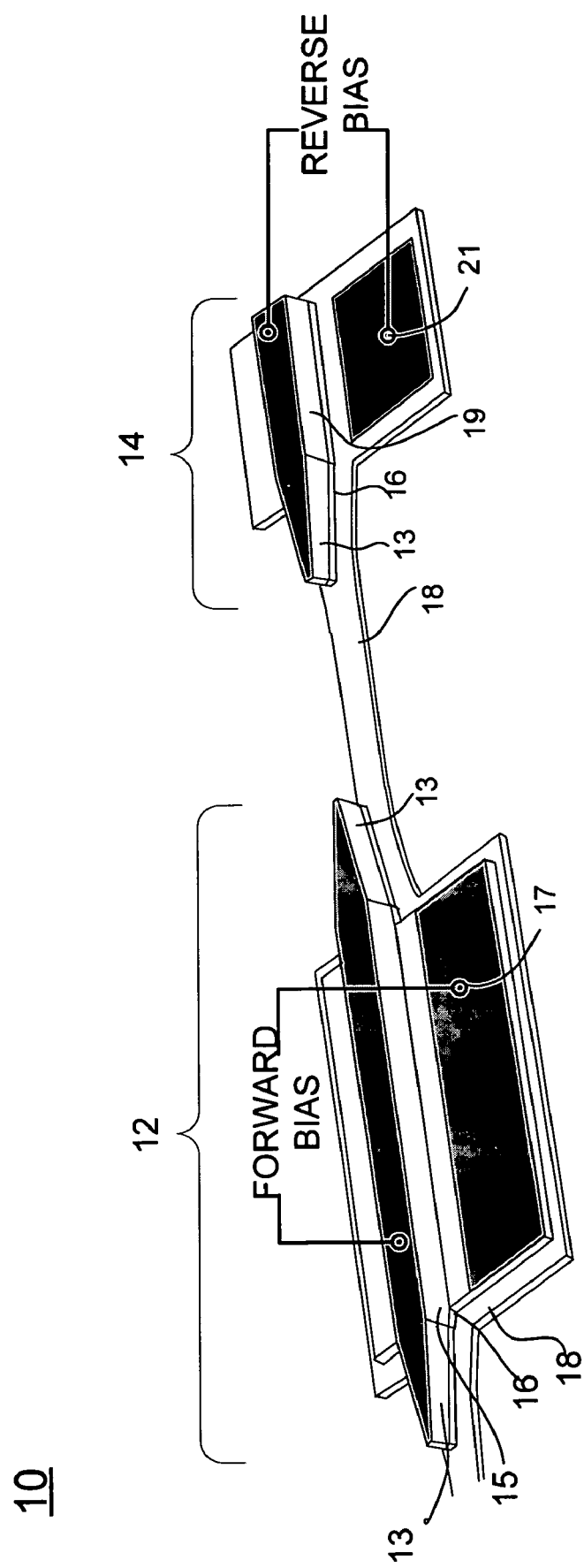
FIG. 1 is a perspective view of an integrated semiconductor optical amplifier and detector.

FIG. 1 provides a perspective view of an illustrative asymmetric twin waveguide (ATG) structure/device 10 with a monolithically integrated semiconductor optical amplifier (SOA) 12 and detector 14 formed therein. Structure 10 comprises a first waveguide layer 18, which may be a passive waveguide such as a fiber guide, and a second active waveguide layer 16 formed on top of passive waveguide 18. Passive waveguide 18 is formed on substrate 20 (not shown). Amplifier 12 and detector 14 are formed in the same active waveguide layer 16. Forming amplifier 12 and detector 14 in a single active layer 16 in an ATG structure eliminates re-growth steps and thereby simplifies the overall fabrication process of integrated photonic devices.

In illustrative ATG structure 10, a first mode of light and a second mode of light that propagate in structure 10 are divided unequally between passive waveguide layer 18 and active waveguide layer 16. Waveguides 16 and 18 have differing indices of refraction, resulting in the uneven division of light in the regions where the waveguides 16 and 18 overlap. In an exemplary embodiment, active waveguide 16 has a higher refractive index than passive waveguide 18. The first mode of light is confined primarily to passive waveguide 18, while the second mode of light is confined primarily to active waveguide 16. Because the second mode of light, as compared to the first mode, is confined primarily to active waveguide layer 16, the second mode of light is primarily effected by amplifier 12 and detector 14 formed in active waveguide layer 16.

In illustrative structure 10, amplifier 12 comprises a portion of active waveguide layer 16. The portion of waveguide layer 16 comprised in amplifier 12 may have tapers 13 formed therein for facilitating the transfer of light energy into and out of waveguide layer 16. In an illustrative embodiment, tapers 13 may be lateral tapers with exponential or polynomial shapes, but may comprise any geometry, shape, or configuration operable to move light between waveguides. Ridge 15 is formed on waveguide 16.

In an illustrative embodiment, active waveguide 16 comprises a bulk material of bandgap that both emits and detects light in a wavelength band of interest. In an illustrative embodiment, active waveguide 16 may include a plurality of quantum wells separated by a plurality of barrier materials. In an illustrative embodiment, an intermixed region may be formed in the taper areas 13 wherein the plurality of quantum wells are intermixed with the plurality of barrier materials. In an alternative embodiment, non-intermixed quantum wells may be employed. In an illustrative embodiment, five quantum wells may be embodied in active waveguide 16. Amplifier 12 further comprises signal contacts 17 formed thereon for applying a forward bias to the portion of waveguide 16 formed in amplifier 12. Applying the forward bias to active waveguide 16 causes light propagating in waveguide 16 to be amplified.

Detector 14 also comprises a portion of active waveguide layer 16. The portion of waveguide layer 16 comprised in detector 14 may have a taper 13 formed therein for facilitating movement of light energy into waveguide 16. Ridge 19 is formed on top of waveguide 16. As previously mentioned, in an illustrative embodiment, active waveguide 16 may comprise a plurality of quantum wells separated by a plurality of barrier materials. Detector 14 further comprises signal contacts 21 for applying a reverse bias to the portion of waveguide layer 16 formed in detector 14. Applying a reverse bias to active waveguide 16 allows for detecting light that is propagating in waveguide 16.

Figure 2:
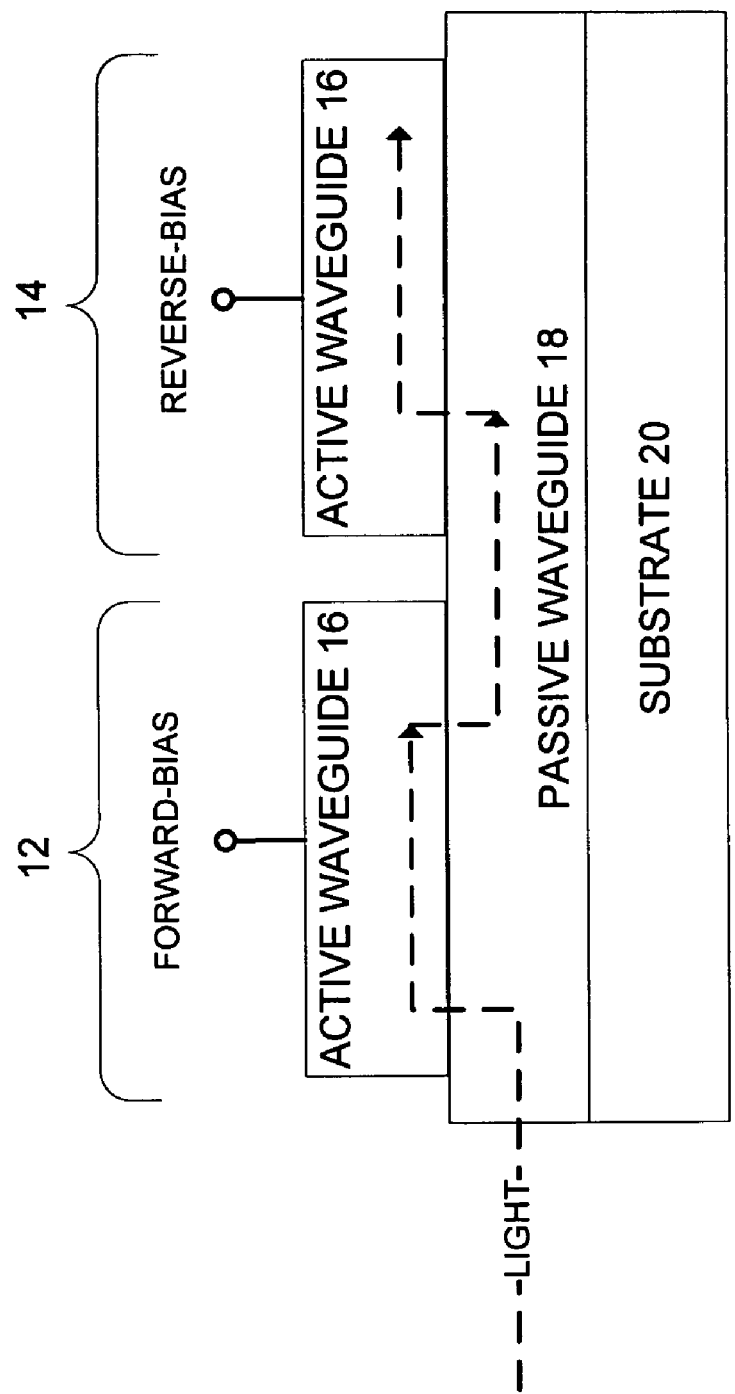
FIG. 2 is a schematic view of an integrated semiconductor optical amplifier and detector.

FIG. 2 illustrates the movement of light energy in illustrative device 10. Light energy, which is depicted using broken lines, enters passive waveguide 18 (shown at the left of FIG. 2) and is coupled into the portion of active waveguide layer 16 that forms amplifier 12. The coupling may be facilitated by a taper 13 formed in waveguide 16. While propagating in the portion of waveguide 16 incorporated in amplifier 12, the light energy is amplified as a result of the forward bias applied to active waveguide 16. The amplified light energy is coupled back into passive waveguide 18, where it propagates toward detector 14. The amplified light propagates in passive waveguide 18 and is coupled into active waveguide 16 beginning in the area where the two overlap. While propagating in the portion of waveguide layer 16 corresponding to detector 14, light energy is absorbed as part of the operation of detector 14 and as a result of the reverse bias applied to waveguide layer 16. Thus, in the illustrative embodiment, the same waveguide epitaxial structure or layer, active waveguide 16, is used for both amplification and detection of light.

The integrated illustrative structure 10 may be fabricated by a single epitaxy growth step and does not require further re-growth steps, resulting in a simplified fabrication and design. In the illustrated embodiment, amplifier 12 and the detector 14 are positioned back-to-back on device 10. However, amplifier 12 and the detector 14 are not limited to this placement and may be formed at other various portions of integrated structure 10.

Figure 3:
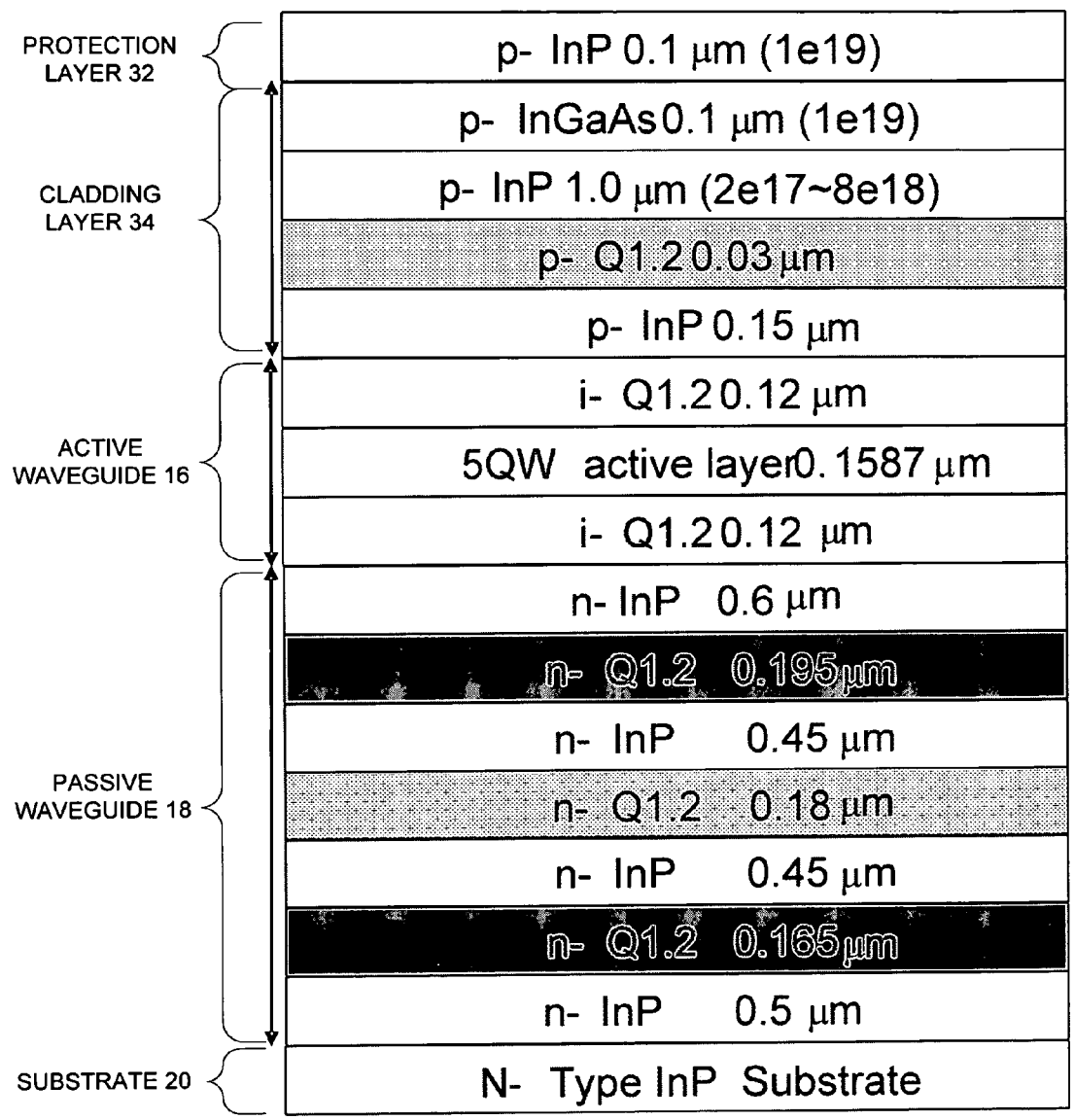
FIG. 3 is a layer structure diagram of an integrated semiconductor optical amplifier and detector.

FIG. 3 is a diagram depicting material layers comprised in an illustrative embodiment of structure 10. As shown, structure 10 may comprise protection layer 32, cladding layer 34, active waveguide 16, passive waveguide 18, and insulating or conducting substrate 20. In an exemplary embodiment, protection layer 32, which operates to physically protect the operational components of structure 10, is a 0.1 μm-thick InP layer. Cladding layer 34, which corresponds to ridges 15 and 17 above, may comprise a 0.1 μm-thick InGaAs layer, a 1.0 μm-thick InP layer, a 0.03 μm-thick Q1.2 layer, and a 0.15 μm-thick InP layer.

Active waveguide layer 16 may comprise, in an exemplary embodiment, five quantum wells separated by barriers, wherein the quantum well-barrier structure is sandwiched between two 0.12 μm-thick Q1.2 layers that are substantially transparent to the movement of light into and out of the waveguide 16. Quantum-well intermixing (QWI), which relies on the mixing of quantum wells and barrier materials of an active region, may be used to reduce absorption loss in the active layers in couplers employing ATG technology.

In an illustrative embodiment, passive waveguide 18 layer may comprise the following: a 0.6 µm-thick InP layer, a 0.195 µm-thick Q1.2 layer, a 0.45 µm-thick InP layer, a 0.18 µm-thick Q1.2 layer, a 0.45 µm-thick InP layer, a 0.165 µm-thick Q1.2 layer, and a 0.5 µm-thick InP layer. In an illustrative embodiment, the multiple layers of passive waveguide 18 are n-doped. Insulating substrate 20 may be a semi-insulating, N-type or P-type InP layer.

In the illustrative embodiment depicted in FIGS. 1-3, the forward-biased, i.e., amplifier, and reverse-biased, i.e., detector, regions of active waveguide 16 are electrically isolated by the imposition of a gap between the two regions. While the two regions are electrically insulated, light is communicated between the two regions via passive waveguide 18. In another embodiment, electrical insulation between the forward-biased and reverse-biased regions may be provided through means other than a gap such as, for example, by forming an insulating region in active waveguide 16 between the forward-bias and reverse-bias. The electrical insulation may be formed, for example, by proton bombardment and/or by ion implantation.

Figure 4B:
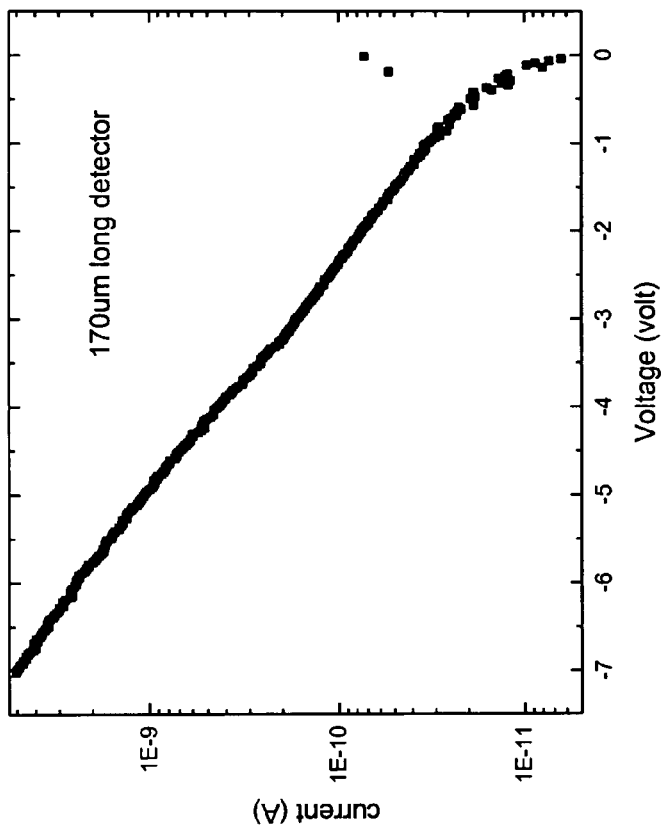
FIGS. 4A and 4B depict the current-voltage responses of a semiconductor optical amplifier and a detector formed in a photonic integrated circuit.
Figure 4A:
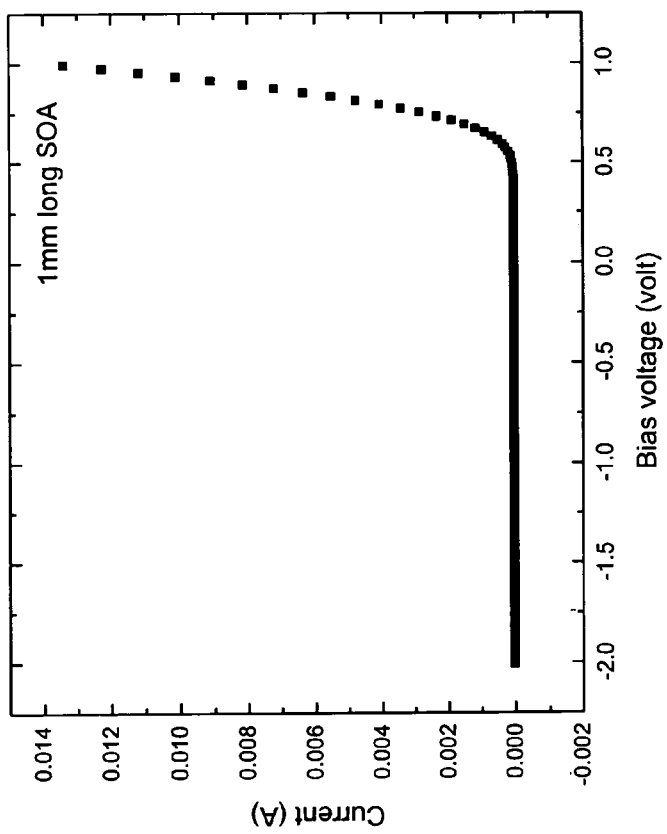

Current-voltage characteristics of illustrative structure 10, and more particularly of illustrative amplifier 12 and detector 14, may be computed in order to determine a turn-on voltage of amplifier 12 and the reverse-bias current of detector 14. FIG. 4A provides a graph depicting current as a function of bias voltage for an illustrative 1 mm long amplifier 12. As shown, for an illustrative embodiment, the turn-on voltage is approximately 0.68 V at 1 mA. FIG. 4B provides a graph depicting reverse bias current as a function of voltage for an illustrative 170 µm long detector 14. The dark-current for an illustrative detector 14 is 5 nA at a reverse bias of 7 V.

Figure 5B:
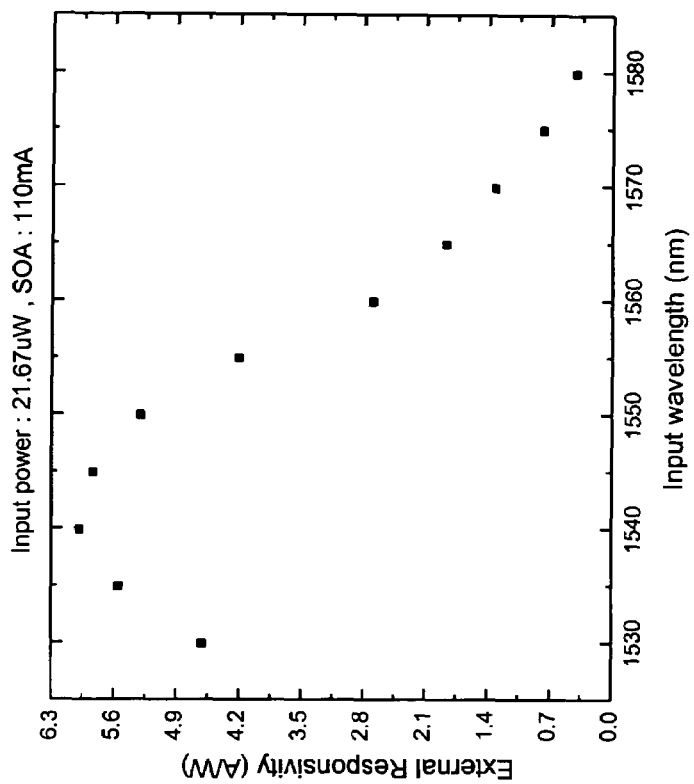
FIGS. 5A and 5B depict the responsivity characteristics of a semiconductor optical amplifier and detector formed in a photonic integrated circuit.
Figure 5A:
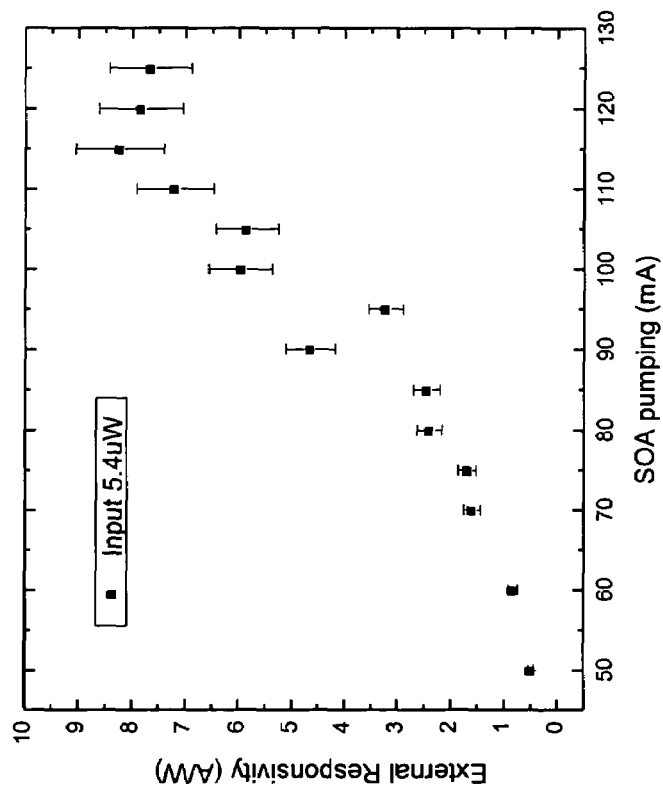

FIGS. 5A and 5B illustrate the responsivity characteristics of an illustrative amplifier 12 and a detector 14. FIG. 5A depicts the change in responsivity due to increasing pump current to amplifier 12. Increasing current to amplifier 12 increases gain, thereby increasing the intensity of light as seen by detector 14. As shown, for an illustrative embodiment, the peak responsivity of 8.23 A/W occurs at a SOA pump current of 115 mA. The input power for this measurement was 5.4 µW at a 1540 nm wavelength.

FIG. 5B depicts responsivity as a function of wavelength for an illustrative embodiment of detector 14. In particular, the graph depicts responsivity as a function of wavelengths varying from 1530 nm to 1580 nm. As shown, the peak responsivity occurs at approximately 1540 nm. The 3 dB optical bandwidth is about 30 nm assuming a symmetric spectrum about the peak value.

Figure 6:
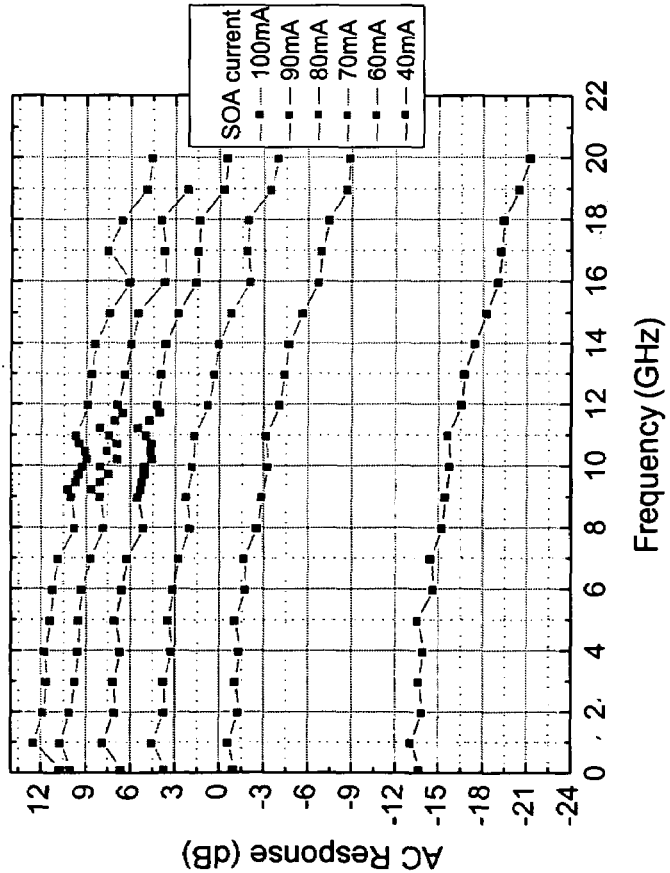
FIG. 6 depicts the radio-frequency bandwidth of an integrated semiconductor optical amplifier and detector.

FIG. 6 is a graph of the radio-frequency bandwidth of an illustrative structure 10 at different SOA input currents. As shown, increasing the SOA current causes the responsivity to increase, thereby producing a larger RF signal. In an illustrative embodiment, the 3 dB bandwidth is determined to be approximately 11 GHz.

Figure 7:
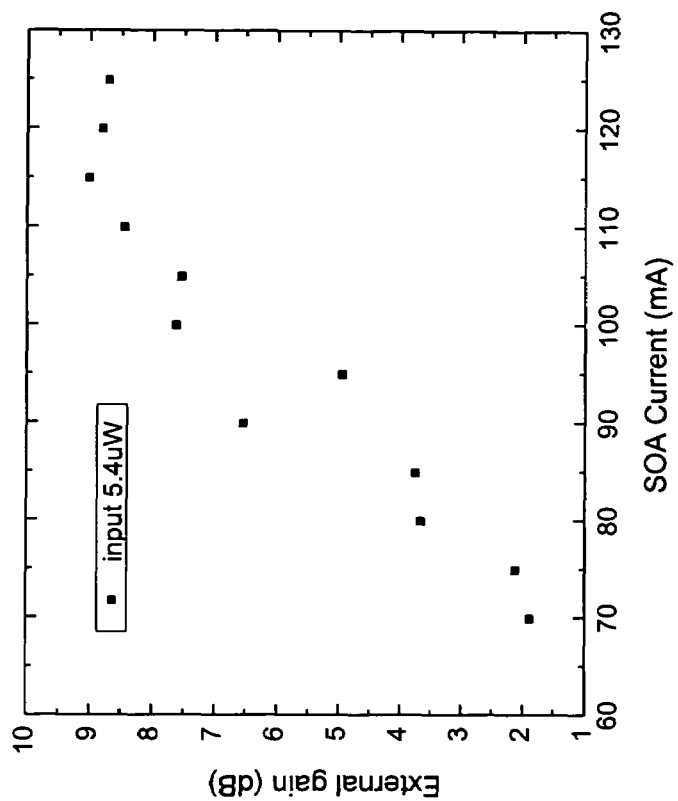
FIG. 7 depicts an external gain characteristics of a detector.

FIG. 7 is a graph depicting the external gain characteristics of structure 10. Estimating the responsivity of detector 14 to be 1.07 A/W, the gain from the fiber-to-detector (external gain) is about 9 dB. In an embodiment wherein waveguide 18 is coated with anti-reflection coating, the gain may be 10.5 db.

Thus, structure 10 has been disclosed comprising an amplifier 12 and detector 14 formed in a single active waveguide layer 16 that is asymmetric from the underlying passive waveguide layer 18. Forming amplifier 12 and detector 14 in a single waveguide layer simplifies the fabrication process. There are numerous applications of the technology disclosed herein. For example, the above-described integrated amplifier and detector may be employed in a reconfigurable optical add-drop multiplexer (ROADM), an integrated receiver, a wavelength converter, etc. Indeed, the disclosed structure/device is suitable for use in any photonic device that requires a combination of amplifiers and detectors.

It is noted that the foregoing examples have been provided merely for the purpose of explanation and are in no way to be construed as limiting of the potential embodiments and applications. While the concepts have been described with reference to various embodiments, it is understood that the words which have been used herein are words of description and illustration, rather than words of limitation and that other embodiments are considered suitable. For example, while device 10 has been described as generally comprising an amplifier and detector, devices in conformance with the ideas disclosed herein could comprise additional components which might be arranged in numerous different configurations. Further, although the novel concepts have been described herein with reference to particular means, materials, and embodiments, the concepts are not intended to be limited to the particulars disclosed herein; rather the concepts extend to all functionally equivalent structures, methods, and uses, such as are within the scope of the appended claims.

What is claimed:

1. A monolithically integrated device having at least a first mode of light and a second mode of light propagating therein, comprising:
   a first waveguide having a first effective index of refraction; and
   a second waveguide optically coupled to the first waveguide, the second waveguide having a second effective index of refraction, and having an amplifier and a detector formed therein;
   wherein light energy propagates from the amplifier in the second waveguide to the first waveguide, and then from the first waveguide to the detector formed in the second waveguide, and
   wherein the first mode of light and the second mode of light are divided unequally between the first waveguide and the second waveguide.

2. The device of claim 1, wherein the amplifier comprises a first and second taper separated by a first ridge, and wherein the detector comprises a third taper and a second ridge.

3. The device of claim 2, wherein the first, second, and third tapers are lateral tapers.

4. The device of claim 3, wherein the lateral tapers have an exponential curve.

5. The device of claim 1, wherein the second waveguide comprises a plurality of quantum wells separated by a plurality of barriers.

6. The device of claim 1, wherein the second waveguide comprises a bulk material of bandgap that both emits and detects light in a wavelength band of interest.

7. The device of claim 5, wherein the plurality of quantum wells and the plurality of barriers are intermixed.

8. The device of claim 7, wherein the plurality of quantum wells and the plurality of barriers are intermixed only at at least one of the first and second tapers.

9. The device of claim 1, wherein the amplifier is a semiconductor optical amplifier.

10. The device of claim 1, wherein the first waveguide has a lower effective index of refraction than the second waveguide.

11. The device of claim 1, wherein the first mode of light is primarily confined to the first waveguide and the second mode of light is primarily confined to the second waveguide.

12. The device of claim 1, wherein the amplifier has a forward bias applied thereto and the detector has a reverse bias applied thereto.

13. An optical device comprising:
- a first waveguide layer having a first effective index of refraction and for guiding primarily a first mode of light;
- a second waveguide layer having a second effective index of refraction and for guiding primarily a second mode of light, said second waveguide layer being an active waveguide layer;
- a first set of electrical contacts for applying a forward bias to the second waveguide layer to amplify light propagating in the second waveguide layer; and
- a second set of electrical contacts for applying a reverse bias to the second waveguide layer to detect light propagating in the second waveguide layer,
- wherein the first mode of light and the second mode of light are divided unequally between the first waveguide and the second waveguide.

14. The device of claim 13, wherein the second waveguide layer has a first taper and second taper formed therein for coupling light into and out of the second waveguide layer in an area of the second waveguide layer having a forward bias applied thereto.

15. The device of claim 14, wherein the second waveguide has a third taper formed therein for coupling light into the second waveguide layer in an area of the second waveguide layer having a reverse bias applied thereto.

16. The device of claim 13, wherein the second waveguide layer comprises a plurality of quantum wells separated by a plurality of barriers.

17. The device of claim 13, further comprising an electrically insulating region located between the first set of electrical contacts and the second set of electrical contacts.

18. The device of claim 17, wherein the electrically insulating region is formed in said second waveguide layer by proton bombardment.

19. The device of claim 17, wherein the electrically insulating region is formed in said second waveguide layer by ion implantation.

20. An monolithic optical device, comprising:
- an amplifier, said amplifier comprising a first portion of a first waveguide and a second waveguide having different effective indices of refraction and having a first mode of light and a second mode of light divided unequally between the first waveguide and the second waveguide; and
- a detector, said detector comprising a second portion of the first waveguide and the second waveguide, the first waveguide and the second waveguide having different effective indices of refraction and having the first mode of light and the second mode of light divided unequally between the first waveguide and the second waveguide.

21. The monolithic optical device of claim 20, wherein in the amplifier the second waveguide is an active waveguide having a forward bias applied thereto to amplify light propagating in the second waveguide.

22. The monolithic optical device of claim 21, wherein in the detector the second waveguide is an active waveguide having a reverse bias applied thereto to detect light propagating in the second waveguide.

23. The monolithic optical device of claim 20, wherein the second waveguide and the first waveguide comprise substantially similar epitaxial structure.

24. The monolithic optical device of claim 20, wherein the first waveguide communicates light between the amplifier and the detector.

* * * * *